United States Patent
Fu

(10) Patent No.: US 8,353,600 B1
(45) Date of Patent: Jan. 15, 2013

(54) MEMS ACTUATOR ASSEMBLY FOR OPTICAL SWITCH

(75) Inventor: Yee-Chung Fu, Fremont, CA (US)

(73) Assignee: Advanced NuMicro Systems, Inc., San Jose, CA (US)

( * ) Notice: Subject to any disclaimer, the term of this patent is extended or adjusted under 35 U.S.C. 154(b) by 168 days.

(21) Appl. No.: 12/822,180

(22) Filed: Jun. 23, 2010

(51) Int. Cl.
*G02B 5/08* (2006.01)

(52) U.S. Cl. .................................................. 359/849

(58) Field of Classification Search .... 359/223.1–226.1, 359/290, 291, 871, 872
See application file for complete search history.

(56) References Cited

U.S. PATENT DOCUMENTS

| | | | |
|---|---|---|---|
| 6,914,710 B1 | 7/2005 | Novotny et al. | |
| 7,355,317 B2 * | 4/2008 | Greywall | 359/225.1 |

* cited by examiner

*Primary Examiner* — Euncha Cherry
(74) *Attorney, Agent, or Firm* — Patent Law Group LLP; David C. Hsia

(57) ABSTRACT

A micro-electro-mechanical system (MEMS) actuator assembly includes a mirror and four actuators. Each actuator includes a lever pivotable about a fulcrum axis. The inner end of each lever is coupled to one side of the mirror. Force is applied to one outer end of the levers to move one side of the mirror, which positions the mirror in one of four positions. Force is applied to two outer ends of the levers to move two sides of the mirror, which positions the mirror in one of four additional positions.

16 Claims, 5 Drawing Sheets

MEMS ACTUATOR ASSEMBLY FOR OPTICAL SWITCH

FIELD OF INVENTION

This invention relates a micro-electromechanical system (MEMS) mirror.

DESCRIPTION OF RELATED ART

Optical fiber is used in optical networks that carry data, voice, and video using multiple wavelengths of light in parallel. Light is routed through the network from its originating location to its final destination. Since optical networks do not generally have a single continuous optical fiber path from every source to every destination, the light is switched as it travels through the optical networks. An optical switch may operate by mechanical means, such as by micro-electromechanical (MEMS) actuators that position a mirror along multiple axes. An example of such as an optical switch is described in U.S. Pat. No. 6,914,710.

SUMMARY

In one embodiment of the invention, a micro-electromechanical system (MEMS) actuator assembly includes a mirror and four actuators. Each actuator includes a lever pivotable about a fulcrum axis. The inner end of each lever is coupled to one side of the mirror. Force is applied to one outer end of the levers to move one side of the mirror, which positions the mirror in one of four positions. Force is applied to two outer ends of the levers to move two sides of the mirror, which positions the mirror in one of four additional positions.

BRIEF DESCRIPTION OF THE DRAWINGS

In the drawings.

Use of the same reference numbers in different figures indicates similar or identical elements.

DETAILED DESCRIPTION OF THE INVENTION

Figure 1:
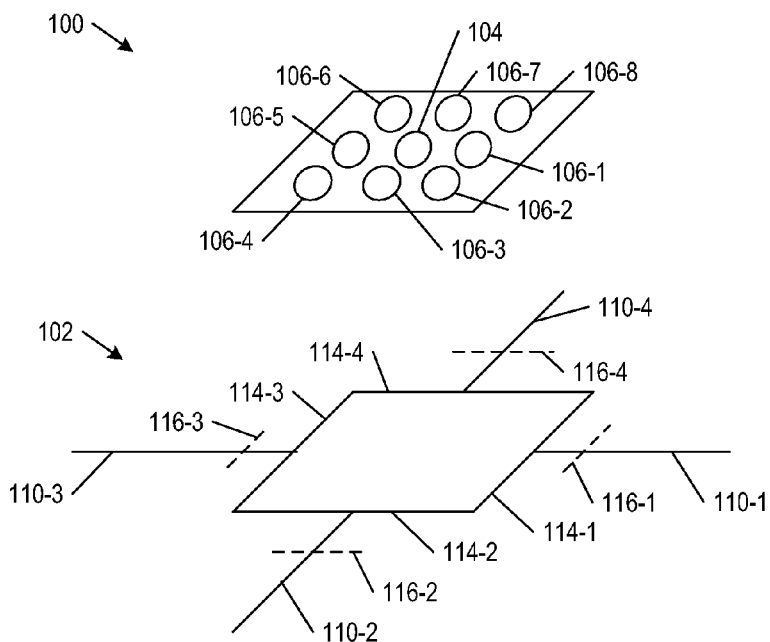
FIG. 1 illustrates a perspective view of an optical switch in one or more embodiments of the present disclosure.

FIG. 1 illustrates a perspective view of an optical switch 100 in one or more embodiments of the present disclosure. Optical switch 100 includes a micro-electromechanical system (MEMS) actuator assembly 102 for directing an optical input signal from an input port 104 to one of, e.g., output ports 106-1, 106-2, 106-3, 106-4, 106-5, 106-6, 106-7, and 106-8 (two or more collectively as "output ports 106"). Input port 104 and output ports 106 may be arranged in a 3 by 3 array with the input port in the middle surrounded by the output ports. MEMS actuator assembly 102 includes a mirror 108 and, in one or more embodiments, actuators 110-1, 110-2, 110-3, and 110-4 (each generically as "actuator 110" and two or more collectively as "actuators 110") hingedly coupled to the mirror.

Each actuator 100 is essentially a lever having an inner end hingedly coupled to mirror 108, an outer end forming part of a driving mechanism, and a fulcrum between the two ends. The driving mechanism may be electrostatic, piezoelectric, electromagnetic, or another similar technique. For symmetrical operation, the inner ends of actuators 110 may be coupled to evenly spaced-out cyclic points along the perimeter of mirror 108 about a mirror center 112. For example, the cyclic points may be centered about rectilinear sides 114-1, 114-2, 114-3, and 114-4 (two or more collectively as "sides 114") of mirror 108. Actuators 110-1, 110-2, 110-3, and 110-4 pivot about respective fulcrum axes 116-1, 116-2, 116-3, and 116-4 (each generically as "fulcrum axis 116" and two or more collectively as "fulcrum axes 116"). The interior angles formed between adjacent fulcrum axes 116 may be the same. For example, fulcrum axis 112-2 is orthogonal to fulcrum axis 112-1, fulcrum axis 112-3 is orthogonal to fulcrum axis 112-2 (and parallel to fulcrum axis 112-1), and fulcrum axis 112-4 is orthogonal to fulcrum axes 112-1 and 112-3 (and parallel to fulcrum axis 112-2). Note the arrangement of actuators 110 with their fulcrum axes 112 and attachment points to mirror 108 increases translational stiffness so that MEMS actuator assembly 102 is more resistant to shock and vibration compared to conventional MEMS actuator assemblies.

Figure 2:
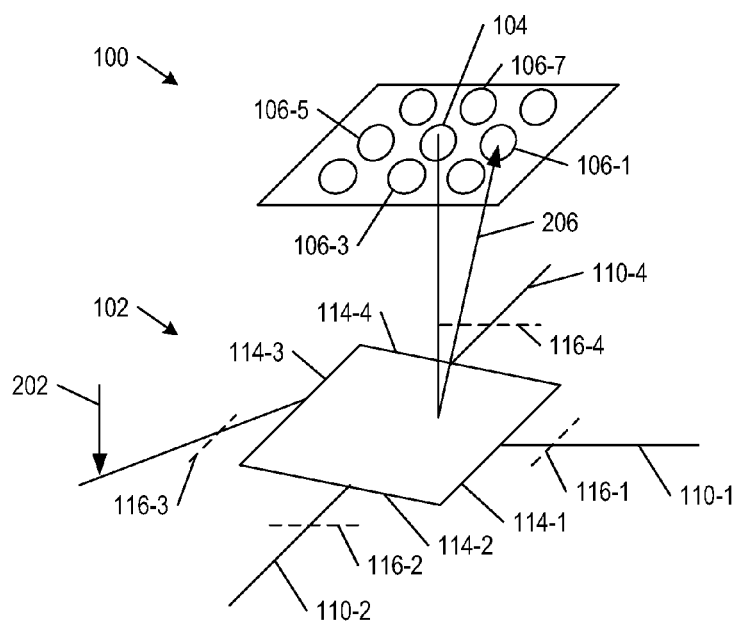
FIG. 2 illustrates the optical switch of FIG. 1 positioning a mirror in one of eight positions in one or more embodiments of the present disclosure.

FIG. 2 illustrates optical switch 100 (FIG. 1) positioning mirror 108 in one of, e.g., eight positions in one or more embodiments of the present disclosure. By operating a single actuator 110, mirror 108 is placed in one of, e.g., four positions as explained below. In the four positions, mirror 108 reflects an optical input signal from input port 104 to respective output ports 106-1, 106-3, 106-5, and 106-7.

For a first position, a downward force 202 is applied to the outer end of actuator 110-3, which moves side 114-3 of mirror 108 up and side 114-1 of the mirror down as the mirror rotates about a rotational axis 204 created by the attachment points of actuators 110-2 and 110-4. In this position, mirror 108 reflects an optical input signal 206 from input port 104 to output port 106-1. The same may be achieved by applying an upward force to the outer end of actuator 110-1.

For a complementary second position, a downward force may be applied to the outer end of actuator 110-1, which would move side 114-1 of mirror 108 up and side 114-3 of the mirror down. In this position, mirror 108 would reflect optical input signal 206 from input port 104 to output port 106-5. The same may be achieved by applying an upward force to the outer end of actuator 110-3.

For a third position, a downward force may be applied to the outer end of actuator 110-4, which moves side 114-4 of mirror 108 up and side 114-2 of the mirror down as the mirror rotates about a rotational axis created by the attachment points of actuators 110-1 and 110-3. In this position, mirror 108 reflects optical input signal 206 from input port 104 to output port 106-3. The same may be achieved by applying an upward force to the outer end of actuator 110-2.

For a complementary fourth position, a downward force may be applied to the outer end of actuator 110-2, which would move side 114-2 of mirror 108 up and side 114-4 of the mirror down. In this position, mirror 108 would reflect optical input signal 206 from input port 104 to output port 106-7. The same may be achieved by applying an upward force to the outer end of actuator 110-4.

Figure 3:
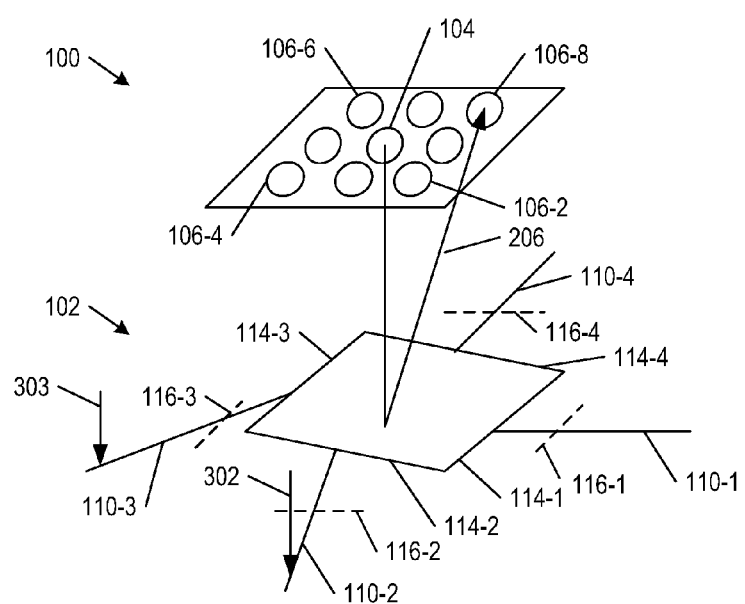
FIG. 3 illustrates the optical switch of FIG. 1 positioning the mirror in another of the eight positions in one or more embodiments of the present disclosure.

FIG. 3 illustrates optical switch 100 (FIG. 1) positioning the mirror in another of the eight positions in one or more embodiments of the present disclosure. By operating two actuators 110, mirror 108 is placed in one of, e.g., four additional positions as explained below. In the four additional positions, mirror 108 reflects an optical input signal from input port 104 to respective output ports 106-2, 106-4, 106-6, and 106-8.

For a fifth position, downward force 302 and 303 are applied to the respective outer ends of actuators 110-2 and 110-3, which move sides 114-2 and 114-3 of mirror 108 up and sides 114-1 and 114-4 of the mirror down. In this position, mirror 108 reflects optical input signal 206 from input port 104 to output port 106-8. The same may be achieved by applying upward forces to the outer ends of actuators 110-1 and 110-4.

For a complementary sixth position, downward forces may be applied to the respective outer ends of actuators 110-1 and 110-4, which would move sides 114-1 and 114-4 of mirror 108 up and sides 114-2 and 114-3 of the mirror down. In this position, mirror 108 would reflect optical input signal 206 from input port 104 to output port 106-4. The same may be achieved by applying upward forces to the outer ends of actuators 110-2 and 110-3.

For a seventh position, downward forces may be applied to the outer ends of actuator 110-3 and 110-4, which moves sides 114-3 and 114-4 of mirror 108 up and sides 114-1 and 114-2 of the mirror down. In this position, mirror 108 reflects optical input signal 206 from input port 104 to output port 106-2. The same may be achieved by applying an upward force to the outer ends of actuators 110-1 and 110-2.

For a complementary eighth position, downward forces may be applied to the outer ends of actuators 110-1 and 110-2, which would move sides 114-1 and 114-2 of mirror 108 up and sides 114-3 and 114-4 of the mirror down. In this position, mirror 108 would reflect optical input signal 206 from input port 104 to output port 106-6. The same may be achieved by applying upward forces to the outer ends of actuators 110-3 and 110-4.

Figure 4:
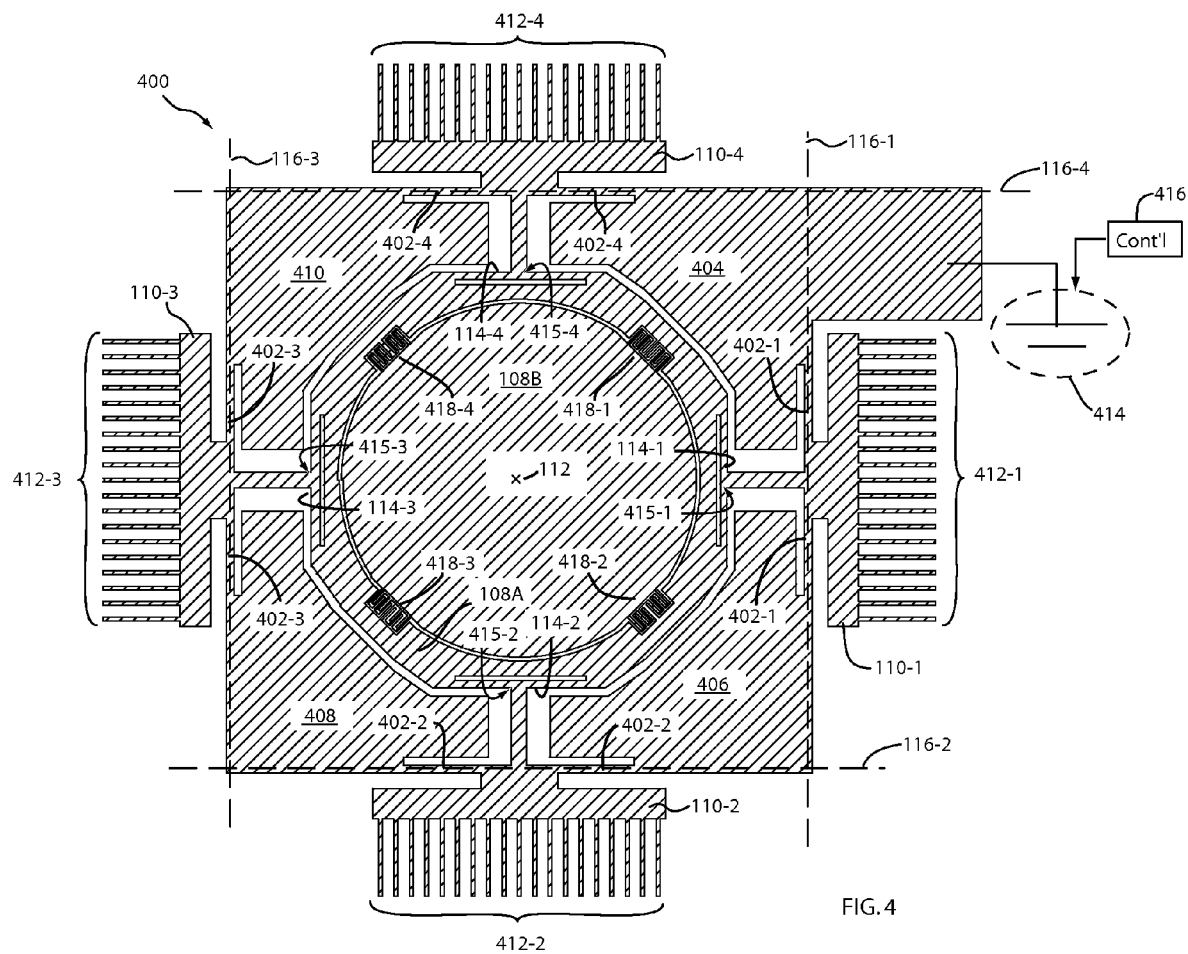
FIG. 4 illustrates a top view of a top layer of a micro-electromechanical system (MEMS) actuator assembly of the optical switch of FIG. 1 in one or more embodiments of the present disclosure.

FIG. 4 illustrates a top view of a top layer 400 of MEMS actuator assembly 102 of optical switch 100 (FIG. 1) in one or more embodiments of the present disclosure. Top layer 400 is formed from or coated with an electrically conductive material. Actuator 110-1 is attached by torsional hinges 402-1 along fulcrum axis 116-1 to anchors 404 and 406. Actuator 110-2 is attached by torsional hinges 402-2 along fulcrum axis 116-2 to anchors 406 and 408. Actuator 110-3 is attached by torsional hinges 402-3 along fulcrum axis 116-3 to anchors 408 and 410. Actuator 110-4 is attached by torsional hinges 402-4 along fulcrum axis 116-4 to anchors 404 and 410.

Mirror 108 may be an integral piece or include a mirror frame 108A and a mirror body 108B within the mirror frame. Mirror body 108B forms the reflective surface and it is connected by springs 418-1, 418-2, 418-3, and 418-4 (two or more collectively as "springs 418") to mirror frame 108A. For symmetrical operation, springs 418 may be located at evenly spaced-out cyclic positions about mirror center 112. Springs 418 may also be evenly spaced-out from the points where actuators 110 are coupled to mirror frame 108A. Springs 418 help to minimize the deformation of mirror body 108B from any rigid body rotation of mirror frame 108A.

The inner ends of actuators 110-1, 110-2, 110-3, and 110-4 are connected by respective torsional hinges 415-1, 415-2, 415-3, and 415-4 (each generically as "torsional hinge 415" and two or more collectively as "torsional hinges 415") to mirror frame 108A. Each torsional hinge 415 may have a first rotational axis aligned with the corresponding fulcrum axis 116, and a second rotational axes aligned along the length of the corresponding actuator 110. The ability to rotate about the first rotational axis may be created by forming a slot behind the corresponding side 114 of mirror frame 108A, and the ability to rotate about the second rotational axis may be created by the joining of the corresponding side 114 and the corresponding inner end of actuator 110.

The outer ends of actuators 110-1, 110-2, 110-3, and 110-4 include respective sets of movable comb teeth 412-1, 412-2, 412-3, and 412-4 (two or more collectively as "movable comb teeth 412"). A voltage source 414 is electrically coupled to provide a voltage or ground to any of the anchors, such as anchor 404. As anchor 404 is physically connected to the other elements in top layer 400, all the elements also electrically coupled to voltage source 414. Voltage source 414 is turned on or off by a controller 416.

Figure 5:
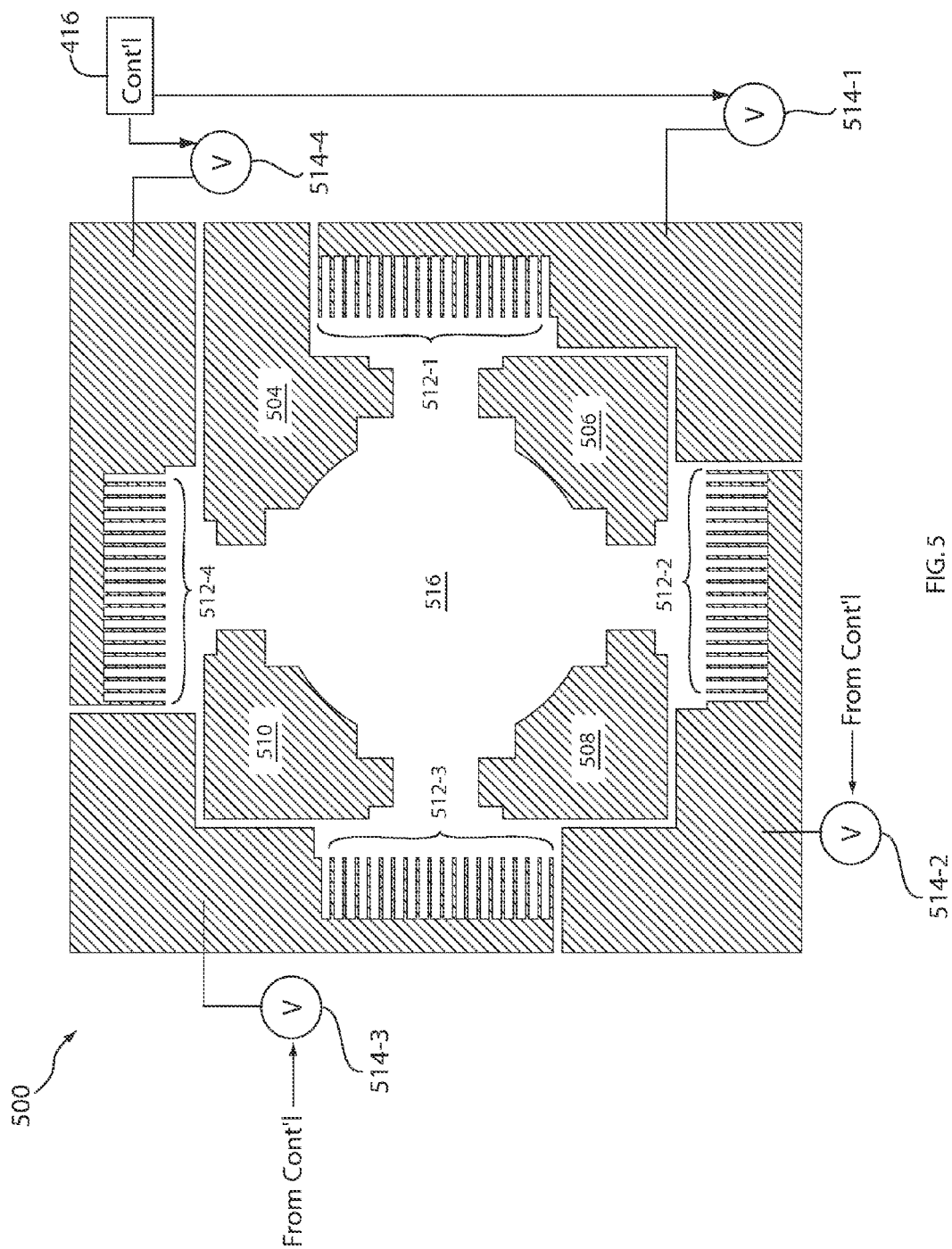
FIG. 5 illustrates a top view of a bottom layer of the MEMS actuator assembly of the optical switch of FIG. 1 in one or more embodiments of the present disclosure.

FIG. 5 illustrates a top view of a bottom layer 500 of MEMS actuator assembly 102 of optical switch (FIG. 1) in one or more embodiments of the present disclosure. Bottom layer 500 is formed from or coated with an electrically conductive material. Top layer 400 (FIG. 4) is bonded to bottom layer 500 from above and they are separated by an insulating layer. Bottom layer 500 includes distinct anchors 504, 506, 508, and 510 that support anchors 404, 406, 408, and 410 (FIG. 4). Bottom layer 500 includes distinct sets of stationary comb teeth 512-1, 512-2, 512-3, and 512-4 (two or more collectively as "stationary comb teeth 512") that are interdigitated out-of-plane with respective sets of movable comb teeth 412-1, 412-2, 412-3, and 412-4 (FIG. 4). Each corresponding pair of comb teeth sets form a driving mechanism for a corresponding actuator 110. A voltage source 514-1 is electrically coupled to provide a voltage to stationary comb teeth 512-1. Voltage sources 514-2, 514-2, 514-3, and 514-4 (two or more collectively as "voltage sources 514") are electrically coupled to provide voltages to the respective sets of stationary comb teeth 512-1, 512-2, 512-3, and 512-4. As the sets of comb teeth 512 are physically distinct from each other, they are not electrically coupled to each other. Voltage sources 514 are individually turned on or off by controller 416.

To drive any individual actuator 110, controller 416 creates a voltage difference between its movable comb teeth 412 and stationary comb teeth 512. For example, controller 416 may use voltage source 414 to ground all the sets of movable comb teeth 412 and turn on the corresponding voltage source 514 to provide a voltage to the corresponding set of stationary comb teeth 512 for actuator 110. The table below illustrates the combination of voltages sources to place mirror 108 in one of eight positions.

TABLE

| Position | Output port | Voltage source 414 (ground) | Voltage source 514-1 | Voltage source 514-2 | Voltage source 514-3 | Voltage source 514-4 |
| --- | --- | --- | --- | --- | --- | --- |
| 1 | 106-1 | On | Off | Off | On | Off |
| 2 | 106-5 | On | On | Off | Off | Off |
| 3 | 106-3 | On | Off | Off | Off | On |
| 4 | 106-7 | On | Off | On | Off | Off |
| 5 | 106-8 | On | Off | On | On | Off |
| 6 | 106-4 | On | On | Off | Off | On |
| 7 | 106-2 | On | Off | Off | On | On |
| 8 | 106-6 | On | On | On | Off | Off |

Figure 6:
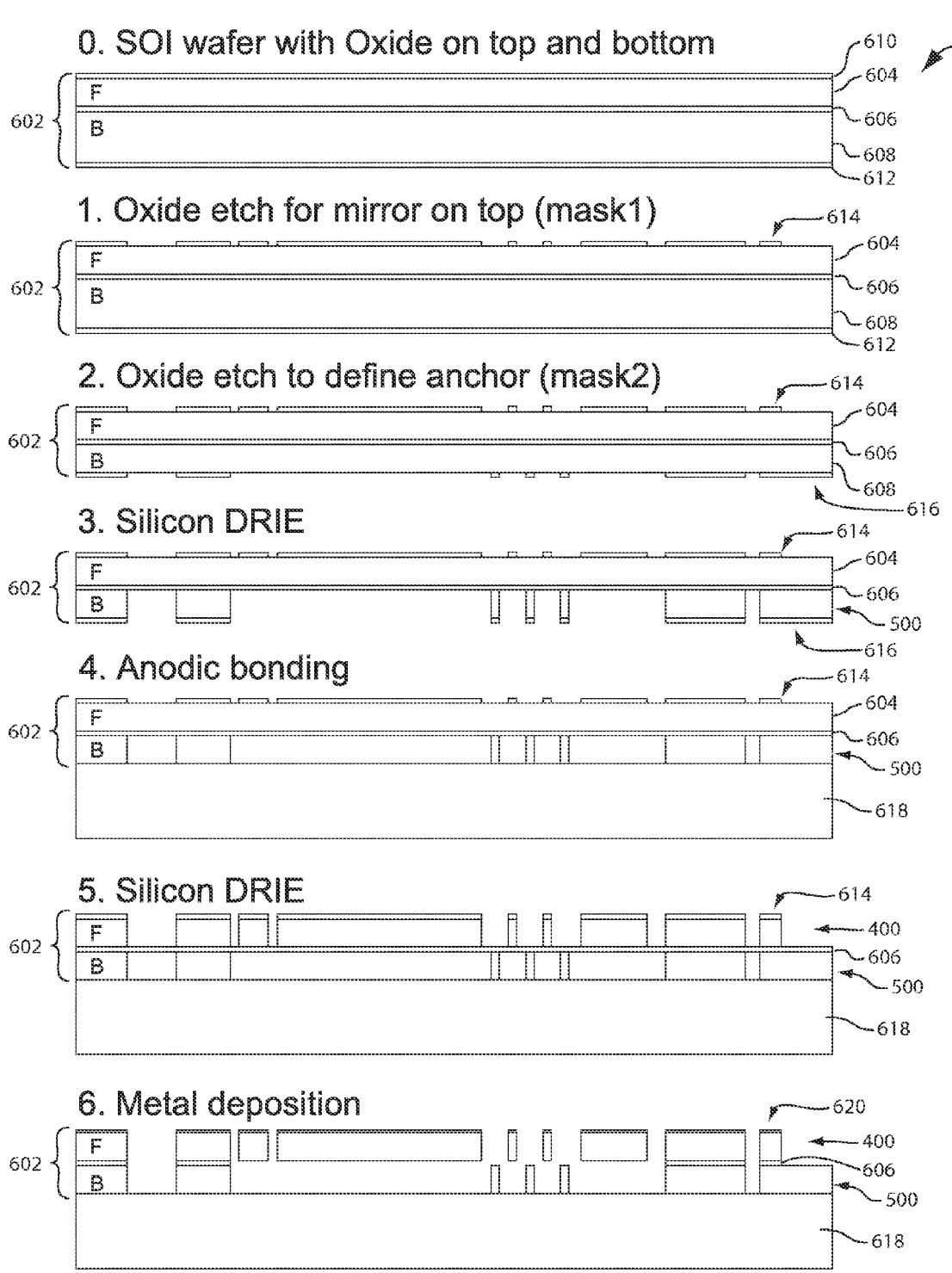
FIG. 6 illustrates a method for making the MEMS actuator assembly of FIGS. 4 and 5 in one or more embodiments of the present disclosure.

FIG. 6 illustrates a method 600 for making MEMS actuator assembly 102 (FIGS. 4 and 5) in one or more embodiments of the present disclosure. In step 0, a silicon-on-insulator (SOI) wafer 602 is provided. SOI 602 wafer includes top silicon layer 604 separated by an oxide layer 606 from a bottom silicon layer 608. SOI wafer further includes top oxide layer 610 on top silicon layer 604 and a bottom oxide layer 612 below bottom silicon layer 608. Step 0 may be followed by step 1.

In step 1, top oxide layer 610 is etched using photolithography to form define a first mask 614 for top layer 400 (FIG. 4). Step 1 may be followed by step 2.

In step 2, bottom oxide layer 612 is etched using photolithography to define a second mask 616 for bottom layer 500 (FIG. 5). Step 2 may be followed by step 3.

In step 3, bottom silicon layer 608 is etched, e.g., by deep reactive-ion etching (DRIE), with second mask 616 to form bottom layer 500 (FIG. 5). Second mask 616 may then be removed by a wet or dry etch. Step 3 may be followed by step 4.

In step 4, SOI wafer 602 is bonded to a wafer 618. If wafer 618 is a glass, e.g., Pyrex, wafer, the bonding process may be anodic bonding and second mask 616 should be removed in step 3. If wafer 618 is a silicon wafer, the bonding process may be fusion bonding. Step 4 may be followed by step 5.

In step 5, top silicon layer 604 is etched, e.g., by DRIE, with first mask 614 to form top layer 400 (FIG. 4). First mask 614 may then be removed by wet or dry etch. Portions of oxide layer 606 are next removed using a hydrofluoric (HF) acid vapor or wet etch to release the various components of MEM actuator assembly 102 while maintaining the bonds between the corresponding anchors 404, 504, 406, 506, 408, 50-8, 410, and 510. Step 5 may be followed by step 6.

In step 6, a metal 620 is deposited on top layer 400 (FIG. 4). Metal 620 may coat mirror 108 to increase reflectivity. Metal 620 may also form the bond pads for wires to voltage sources 414, 514-1, 514-2, 514-3, and 514-4. Afterwards individual devices may be singulated from the final wafer.

Various other adaptations and combinations of features of the embodiments disclosed are within the scope of the invention. While four actuators 110 are shown, three actuators 110 may be used to perform 2-D mirror tilting. Furthermore, more than four actuators 110 may be used to perform 2-D mirror tilting. As discussed above, the inner ends of actuators 110 may be coupled to evenly spaced-out cyclic points along the perimeter of mirror 108 about a mirror center 112, and the interior angles formed between adjacent fulcrum axes 116 may be the same. Numerous embodiments are encompassed by the following claims.

The invention claimed is:

1. A micro-electro-mechanical system (MEMS) actuator assembly, comprising:
a mirror;
a first actuator, comprising:
a first plurality of stationary comb teeth;
a first lever pivotable about a first fulcrum axis, the first lever having:
a first inner end hingedly coupled to a first side of the mirror; and
a first outer end comprising a first plurality of movable comb teeth interdigitated out of plane with the first plurality of stationary comb teeth to actuate the first lever;
a second actuator, comprising:
a second plurality of stationary comb teeth;
a second lever pivotable about a second fulcrum axis, the second lever having:
a second inner end hingedly coupled to a second side of the mirror; and
a second outer end comprising a second plurality of movable comb teeth interdigitated out of plane with the second plurality of stationary comb teeth to actuate the second lever;
a third actuator, comprising:
a third plurality of stationary comb teeth;
a third lever pivotable about a third fulcrum axis, the third lever having:
a third inner end hingedly coupled to a third side of the mirror; and
a third outer end comprising a third plurality of movable comb teeth interdigitated out of plane with the third plurality of stationary comb teeth to actuate the third lever; and
a fourth actuator, comprising:
a fourth plurality of stationary comb teethe
a fourth lever pivotable about a fourth fulcrum axis, the fourth lever having:
a fourth inner end hingedly coupled to a fourth side of the mirror; and
a fourth outer end comprising a fourth plurality of movable comb teeth interdigitated out of plane with the fourth plurality of stationary comb teeth to actuate the fourth lever.

2. The assembly of claim 1, further comprising:
a first anchor;
a second anchor, wherein the first lever is connected by first hinges along the first fulcrum axis to the first and the second anchors;
a third anchor, wherein the second lever is connected by second hinges along the second fulcrum axis to the second and the third anchors; and
a fourth anchor, wherein the third lever is connected by third hinges along the third fulcrum axis to the third and the fourth anchors, and the fourth lever is connected by fourth hinges along the fourth fulcrum axis to the fourth and the first anchors.

3. The assembly of claim 1, wherein the first, the second, the third, and the fourth pluralities of movable comb teeth are located above the first, the second, the third, and the fourth pluralities of stationary comb teeth.

4. The assembly of claim 1, further comprising:
a first voltage source electrically coupled to the first plurality of stationary comb teeth;
a second voltage source electrically coupled to the second plurality of stationary comb teeth;
a third voltage source electrically coupled to the third plurality of stationary comb teeth;
a fourth voltage source electrically coupled to the fourth plurality of stationary comb teeth; and
a fifth voltage source electrically coupled to the first, the second, the third, and the fourth pluralities of movable comb teeth.

5. The assembly of claim 4, wherein the mirror and the first, the second, the third, and the fourth pluralities of movable comb teeth are electrically coupled.

6. The assembly of claim 4, further comprising
a controller coupled to the first, the second, the third, the fourth, and the fifth voltage sources, wherein the controller is configured to turn on:
the first and the fifth voltage sources to position the mirror in a first position;
the second and the fifth voltage sources to position the mirror in a second position;

the third and the fifth voltage sources to position the mirror in a third position;

the fourth and the fifth voltage sources to position the mirror in a fourth position;

the first, the second, and the fifth voltage sources to position the mirror in a fifth position;

the second, the third, and the fifth voltage sources to position the mirror in a sixth position;

the third, the fourth, and the fifth voltage sources to position the mirror in a seventh position; and the first, the fourth, and the fifth voltage sources to position the mirror in an eighth position.

7. The assembly of claim 1, wherein each inner end is coupled by a hinge to a corresponding side, the hinge allowing rotation about a first hinge axis parallel to a corresponding fulcrum axis and rotation about a second hinge axis along a length of a corresponding lever.

8. The assembly of claim 1, wherein the first, the second, the third, and the fourth inner ends are hingedly coupled to the mirror at evenly spaced out cyclic points about a center of the mirror.

9. The assembly of claim 8, wherein the mirror comprises:
a mirror frame, wherein the first, the second, the third, and the fourth inner ends are hingedly coupled to the mirror frame;
a mirror body within the mirror frame; and
springs connecting the mirror body to the mirror frame.

10. The assembly of claim 9, wherein the springs are located at evenly spaced-out cyclic positions about the mirror center, and the springs are evenly spaced-out from the cyclic points where the first, the second, the third, and the fourth inner ends are hingedly coupled to the mirror frame.

11. A method for operating a micro-electro-mechanical system (MEMS) actuator assembly, comprising:
applying one or more vertical forces on one or more outer ends of one or more levers, each pivotable about a fulcrum axis, to move one or more sides of a mirror hingedly coupled to one or more inner ends of the one or more levers to position the mirror in one of a plurality of positions.

12. The method of claim 11, wherein said applying one or more vertical force on one or more outer ends of one or more levers comprises:
applying a first vertical force on a first outer end of a first lever pivotable about a first fulcrum axis to move a first side of a mirror hingedly coupled to a first inner end of the first lever to position the mirror in a first position;
applying a second vertical force on a second outer end of a second lever pivotable about a second fulcrum axis to move a second side of the mirror hingedly coupled to a second inner end of the second lever to position the mirror in a second position;
applying a third vertical force on a third outer end of a third lever pivotable about a third fulcrum axis to move a third side of the mirror hingedly coupled to a third inner end of the third lever to position the mirror in a third position; and
applying a forth vertical force on a fourth outer end of a fourth lever pivotable about a fourth fulcrum axis to move a fourth side of the mirror hingedly coupled to a fourth inner end of the fourth lever to position the mirror in a fourth position.

13. The method of claim 12, wherein
said applying a first vertical force on the first outer end of the first lever comprises providing a first voltage difference between a first plurality of movable comb teeth at the first outer end of the first lever and a first plurality of stationary comb teeth;

said applying a second vertical force on the second outer end of the second lever comprises providing a second voltage difference between a second plurality of movable comb teeth at the second outer end of the second lever and a second plurality of stationary comb teeth;

said applying a third vertical force on the third outer end of the third lever comprises providing a third voltage difference between a third plurality of movable comb teeth at the third outer end of the third lever and a third plurality of stationary comb teeth; and said applying a fourth vertical force on the fourth outer end of the fourth lever comprises providing a fourth voltage difference between a fourth plurality of movable comb teeth at the fourth outer end of the fourth lever and a fourth plurality of stationary comb teeth.

14. The method of claim 12, wherein said applying one or more vertical forces on one or more outer ends of one or more levers further comprises:

applying a first plurality of vertical forces on the first and the second outer ends of the first and the second levers to move the first and the second sides of the mirror to position the mirror in a fifth position;

applying a second plurality of vertical forces on the second and the third outer ends of the second and the third levers to move the second and the third sides of the mirror to position the mirror in a sixth position;

applying a third plurality of vertical forces on the third and the fourth ends of the third and the fourth levers to move the third and the fourth sides of the mirror to position the mirror in a seventh position; and applying a fourth plurality of vertical forces on the first and the fourth outer ends of the first and the fourth levers to move the first and the fourth sides of the mirror to position the mirror in an eighth position.

15. The method of claim 14, wherein:
said applying a first vertical force on the first outer end of the first lever comprises providing a first voltage difference between a first plurality of movable comb teeth at the first outer end of the first lever and a first plurality of stationary comb teeth;

said applying a second vertical force on the second outer end of the second lever comprises providing a second voltage difference between a second plurality of movable comb teeth at the second outer end of the second lever and a second plurality of stationary comb teeth;

said applying a third vertical force on the third outer end of the third lever comprises providing a third voltage difference between a third plurality of movable comb teeth at the third outer end of the third lever and a third plurality of stationary comb teeth;

said applying a fourth vertical force on the fourth outer end of the fourth lever comprises providing a fourth voltage difference between a fourth plurality of movable comb teeth at the fourth outer end of the fourth lever and a fourth plurality of stationary comb teeth;

said applying a first plurality of vertical forces on the first and the second outer ends of the first and the second levers comprises providing the first and the second voltage differences;

said applying a second plurality of vertical forces on the second and the third outer ends of the second and the third levers comprises providing the second and the third voltage differences;

said applying a third plurality of vertical forces on the third and the forth outer ends of the third and the fourth levers comprises providing the third and the fourth voltage differences; and said applying a fourth plurality of vertical forces on the first and the fourth outer ends of the first and the fourth levers comprises providing the first and the fourth voltage differences.

16. The method of claim 15, wherein:

providing one or two of the first, the second, the third, and the fourth voltage differences comprises grounding the first, the second, the third, and the fourth pluralities of movable comb teeth and providing a voltage to one or two of the first, the second, the third, and the fourth pluralities of stationary comb teeth.

\* \* \* \* \*